(12) United States Patent
Chiabo et al.

(10) Patent No.: US 11,326,539 B2
(45) Date of Patent: May 10, 2022

(54) METHOD FOR DETECTING A MALFUNCTION OF A VOLTAGE-LIMITING CIRCUIT AND CONTROL SYSTEM FOR IMPLEMENTING SAID MALFUNCTION-DETECTING METHOD

(71) Applicant: VITESCO TECHNOLOGIES GMBH, Hanover (DE)

(72) Inventors: Sébastien Chiabo, Toulouse (FR); Sébastien Delepouve, Toulouse (FR)

(73) Assignee: VITESCO TECHNOLOGIES GMBH, Hanover (DE)

( * ) Notice: Subject to any disclaimer, the term of this patent is extended or adjusted under 35 U.S.C. 154(b) by 0 days.

(21) Appl. No.: 16/973,981

(22) PCT Filed: Jun. 11, 2019

(86) PCT No.: PCT/EP2019/065192
§ 371 (c)(1),
(2) Date: Dec. 10, 2020

(87) PCT Pub. No.: WO2019/238666
PCT Pub. Date: Dec. 19, 2019

(65) Prior Publication Data
US 2021/0247434 A1  Aug. 12, 2021

(30) Foreign Application Priority Data
Jun. 11, 2018 (FR) ........................ 1855069

(51) Int. Cl.
*F02D 41/20* (2006.01)
*G01R 31/52* (2020.01)
*G01R 31/00* (2006.01)

(52) U.S. Cl.
CPC ....... *F02D 41/2096* (2013.01); *G01R 31/007* (2013.01); *G01R 31/52* (2020.01);
(Continued)

(58) Field of Classification Search
CPC ......... F02D 41/2096; F02D 2041/2068; F02D 2041/2089; F02D 2041/2093; G01R 31/007; G01R 31/016; G01R 31/52
See application file for complete search history.

(56) References Cited

U.S. PATENT DOCUMENTS

| 7,455,051 B2* | 11/2008 | Gotzenberger ..... F02D 41/2096 123/478 |
| 8,154,225 B2* | 4/2012 | Nouvel ................... H02N 2/065 318/116 |

(Continued)

FOREIGN PATENT DOCUMENTS

JP  2002134804 A  *  5/2002

OTHER PUBLICATIONS

Fukagawa, JP 2002-134804, machine translation. (Year: 2002).*
(Continued)

*Primary Examiner* — Hung Q Nguyen
*Assistant Examiner* — Mark L. Greene
(74) *Attorney, Agent, or Firm* — Nixon & Vanderhye

(57) ABSTRACT

Disclosed is a method for detecting a malfunction of a voltage-limiting circuit of a control circuit, the control circuit including an output port connected to a capacitive actuator of a motor vehicle, an output voltage on the output port being, in the absence of a malfunction of the voltage-limiting circuit, equal to or lower than a theoretical maximum value. The capacitive actuator is arranged in series with a commutator, the method including steps of: placing the commutator in an open state; activating the control circuit; measuring the output voltage over the output port; and evaluating a criterion for detecting a malfunction of the voltage-limiting circuit as a function of the output voltage.

20 Claims, 2 Drawing Sheets

(52) U.S. Cl.
CPC ............... *F02D 2041/2068* (2013.01); *F02D 2041/2089* (2013.01); *F02D 2041/2093* (2013.01)

(56) References Cited

U.S. PATENT DOCUMENTS

| | | |
|---|---|---|
| 2001/0020804 A1 | 9/2001 | Freudenberg et al. |
| 2002/0093313 A1 | 7/2002 | Hoffmann et al. |
| 2007/0227506 A1 | 10/2007 | Perryman et al. |
| 2008/0006246 A1 | 1/2008 | Perryman et al. |
| 2008/0319699 A1 | 12/2008 | Perryman |
| 2009/0140747 A1 | 6/2009 | Perryman et al. |
| 2009/0314073 A1 | 12/2009 | Perryman et al. |
| 2019/0136781 A1* | 5/2019 | Gargiso ................. F02D 41/20 |
| 2019/0331046 A1* | 10/2019 | Katzenburger ..... F02D 41/2438 |

OTHER PUBLICATIONS

International Search Report for PCT/EP2019/065192 dated Sep. 27, 2019, 8 pages.
Written Opinion of the ISA for PCT/EP2019/065192 dated Sep. 27, 2019, 7 pages.

* cited by examiner

METHOD FOR DETECTING A MALFUNCTION OF A VOLTAGE-LIMITING CIRCUIT AND CONTROL SYSTEM FOR IMPLEMENTING SAID MALFUNCTION-DETECTING METHOD

CROSS-REFERENCE TO RELATED APPLICATIONS

This application is the U.S. national phase of International Application No. PCT/EP2019/065192 filed Jun. 11, 2019 which designated the U.S. and claims priority to FR 1855069 filed Jun. 11, 2018, the entire contents of each of which are hereby incorporated by reference.

BACKGROUND OF THE INVENTION

Field of the Invention

The present invention belongs to the field of motor vehicles, and relates more particularly to a method for detecting a malfunction in a control system for controlling a capacitive actuator, such as a piezoelectric injector of a motor vehicle engine.

Description of the Related Art

Nowadays, in motor vehicles, it is known practice to electrically control piezoelectric injectors by means of a control system notably including a control circuit, which is controlled by the engine computer of the motor vehicle.

Conventionally, the control circuit includes an input port connected to an electrical power source, and an output port connected to the piezoelectric injectors.

In order to limit the output voltage on the output port, for avoiding it becoming too great in case of a problem, it is known practice to provide a voltage-limiting circuit between the input port and the output port of the control circuit. Such a voltage-limiting circuit is generally in the form of one or more Zener diodes which limit the output voltage by an avalanche effect. Because of the presence of this voltage-limiting circuit, the output voltage, across the terminals of the piezoelectric injectors, is in principle always lower than a predefined theoretical maximum value which depends principally on the maximum value of the input voltage and on the respective inverse voltages (Zener voltages) of said Zener diodes.

A piezoelectric injector is a capacitive actuator and therefore behaves in a manner analogous to a capacitor. Conventionally, the control circuit alternates between periods during which it charges or discharges a piezoelectric injector. Over the course of a charging period, said piezoelectric injector is charged gradually so that the output voltage increases gradually across the terminals of said piezoelectric injector. In a known manner, this gradual increase depends on the value of the capacitance of said piezoelectric injector. The period for which the control circuit charges a piezoelectric injector is in principle such that the output voltage does not have time to reach the theoretical maximum value.

In case of a malfunction at a piezoelectric injector, and more particularly in the case of an uncontrolled disconnection of said piezoelectric injector (which is then in an open circuit), then the apparent value of the capacitance at the output port is significantly decreased with respect to the value of the capacitance of the piezoelectric injector. Thus, when the control circuit charges a piezoelectric injector which is in fact disconnected, the output voltage increases much more quickly than anticipated. The output voltage then quickly reaches the theoretical maximum value over the charging period, without however exceeding this theoretical maximum value because of the presence of the voltage-limiting circuit. Thus, the various electronic components of the control system are protected. Furthermore, it is possible, by measuring the output voltage and by comparing it to the theoretical maximum value, to detect the malfunction (open circuit) at the piezoelectric injector since, in the absence of a malfunction, the charging period should not make it possible for the output voltage to reach the theoretical maximum value.

However, in case of a malfunction of the voltage-limiting circuit, the electronic components of the control system are no longer protected and, furthermore, it is then no longer possible to detect a malfunction of the piezoelectric injectors of the engine of the motor vehicle.

SUMMARY OF THE INVENTION

The objective of the present invention is to overcome all or some of the limitations of the solutions of the prior art, notably those discussed hereinabove, by proposing a solution which makes it possible to detect a malfunction of a voltage-limiting circuit of a control system for controlling capacitive actuators of a motor vehicle, such as piezoelectric injectors.

To this end, and according to a first aspect, the invention concerns a method for detecting a malfunction of a voltage-limiting circuit of a control circuit for controlling a capacitive actuator of a motor vehicle, said capacitive actuator being connected to an output port of said control circuit, said control circuit being controlled to charge/discharge said capacitive actuator, an output voltage on the output port being, in the absence of a malfunction of the voltage-limiting circuit, equal to or lower than a theoretical maximum value. The capacitive actuator being, between the output port and electrical ground, arranged in series with a commutator suitable for being placed in a closed state and in an open state, and the control circuit comprising a capacitor arranged between the output port and electrical ground, said method including steps of:
  placing the commutator in the open state,
  controlling the control circuit to charge said capacitor for a predefined period to make it possible, in the absence of a malfunction of the voltage-limiting circuit, for the output voltage to reach the theoretical maximum value,
  measuring the output voltage on the output port,
  evaluating a criterion for detecting a malfunction of the voltage-limiting circuit as a function of the measured output voltage, a malfunction of the voltage-limiting circuit being detected when the detection criterion is verified.

Thus, to detect the malfunction of the voltage-limiting circuit, the capacitive actuator is disconnected from the control circuit by controlling the commutator into the open state, which is tantamount to simulating a malfunction of open circuit type at said capacitive actuator. In the case where several capacitive actuators are arranged in parallel across the output port of the control circuit, all said capacitive actuators are simultaneously disconnected by controlling their respective commutators into the open state.

The detection method then includes controlling the control circuit to charge the capacitor, for a sufficient period to make it possible, in the absence of a malfunction of the voltage-limiting circuit, for the output voltage to reach the theoretical maximum value. Such a period may easily be deduced from the value of the capacitance at the output port when all the capacitive actuators are disconnected.

When the control circuit has charged the capacitor for a sufficient period to make it possible, in the absence of a malfunction of the voltage-limiting circuit, for the output voltage to reach the theoretical maximum value, said output voltage is measured.

As previously indicated, in the absence of a malfunction of the voltage-limiting circuit, the output voltage should in principle converge toward the theoretical maximum value. If this is not the case, then that means that there is probably a malfunction of the voltage-limiting circuit. Evaluating the criterion for detecting a malfunction is therefore aimed at verifying whether or not the output voltage converges toward the theoretical maximum value. If the output voltage does not converge toward the theoretical maximum value, then the detection criterion is considered to be verified and a malfunction of the voltage-limiting circuit is detected.

Such arrangements therefore make it possible to detect a malfunction of the voltage-limiting circuit without necessarily adding electronic components with respect to the prior art. Notably, the electronic components used to measure the output voltage, which is used according to the prior art to detect a malfunction at a capacitive actuator, may be reused to detect a malfunction of the voltage-limiting circuit. Furthermore, certain control circuits according to the prior art already include a capacitor between their output port and electrical ground, for purposes of protection against electrostatic discharges.

Preferably, the detection method is implemented outside of the phases of normal use of the capacitive actuators of the motor vehicle, for example at the initialization of the engine computer of the motor vehicle, upon the starting up of the latter.

In particular implementations, the method for detecting a malfunction may further include one or more of the following features, taken alone or in any technically possible combination.

In particular implementations, evaluating the criterion for detecting a malfunction of the voltage-limiting circuit includes comparing the measured output voltage to a predefined first threshold value lower than the theoretical maximum value of the output voltage, a malfunction being detected when said measured output voltage is lower than said first threshold value.

In particular implementations, evaluating the criterion for detecting a malfunction of the voltage-limiting circuit includes comparing the measured output voltage to a predefined second threshold value higher than the theoretical maximum value of the output voltage, a malfunction being detected when said measured output voltage is higher than said second threshold value.

In particular implementations, the voltage-limiting circuit includes one or more Zener diodes.

In particular implementations, the capacitive actuator is a piezoelectric injector.

According to a second aspect, the invention concerns a motor vehicle computer including means configured to implement a method for detecting a malfunction of a voltage-limiting circuit according to any one of the implementations of the invention.

According to a third aspect, the invention concerns a control system for controlling a capacitive actuator of a motor vehicle, including a control circuit including a voltage-limiting circuit and an output port connected to said capacitive actuator, an output voltage on the output port being, in the absence of a malfunction of the voltage-limiting circuit, equal to or lower than a theoretical maximum value. Furthermore, the capacitive actuator is, between the output port and electrical ground, arranged in series with a commutator suitable for being placed in a closed state and in an open state, and said control system includes a capacitor arranged between the output port and electrical ground, as well as a computer according to any one of the embodiments of the invention.

In particular embodiments of the control system, the voltage-limiting circuit includes one or more Zener diodes.

According to a fourth aspect, the invention concerns a motor vehicle including a capacitive actuator and a control system for controlling said capacitive actuator according to any one of the embodiments of the invention.

In preferred embodiments of the motor vehicle, the capacitive actuator is a piezoelectric injector.

BRIEF DESCRIPTION OF THE DRAWINGS

The invention will be better understood upon reading the following description, given by way of entirely non-limiting example and made with reference to the figures, which show.

DESCRIPTION OF THE PREFERRED EMBODIMENTS

In these figures, references that are identical from one figure to the next denote identical or analogous elements. For the sake of clarity, the elements shown are not to scale, unless indicated otherwise.

As previously indicated, the present invention concerns the detection of malfunctions of control systems for controlling capacitive actuators of motor vehicles.

In the following description, reference is made without limitation to the case in which the capacitive actuators are piezoelectric injectors of the engine of the motor vehicle. The invention is however applicable to any type of motor vehicle actuator which has at least capacitive electrical behavior.

Figure 1:
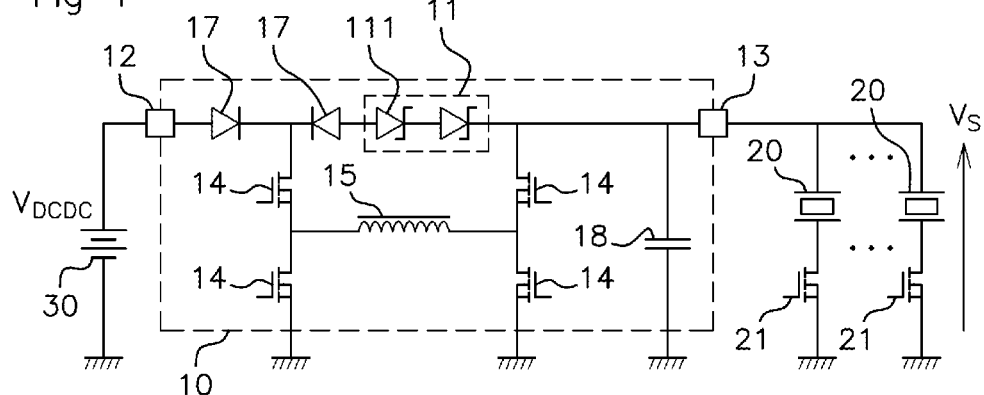
FIG. 1: a schematic representation of one exemplary embodiment of a control system.

FIG. 1 schematically shows one exemplary embodiment of a control system for controlling piezoelectric injectors 20. In the example illustrated by FIG. 1, the same control system is used to electrically control several piezoelectric injectors 20. It should however be noted that the invention is applicable even when the control system is used to control a single capacitive actuator.

As illustrated by FIG. 1, the control system includes a control circuit 10 including an input port 12 and an output port 13. The input port 12 is connected to an electrical supply source 30, such as a DC/DC converter suitable for boosting the voltage supplied by a battery of the motor vehicle, and which supplies a voltage designated by $V_{DCDC}$ in FIG. 1. The voltage $V_{DCDC}$ is for example between 150 volts (V) and 250 V. The output port 13 of the control circuit 10 is connected to the piezoelectric injectors 20.

In the non-limiting example illustrated by FIG. 1, the control circuit 10 is principally in the form of an H-bridge, formed by four commutators 14, and by a coil 15 for regulating the current.

The control circuit 10 also includes a voltage-limiting circuit 11. In general, the invention is applicable to any type of voltage-limiting circuit. FIG. 1 shows a preferred embodiment wherein the voltage-limiting circuit 11 is constituted by two Zener diodes 111. It is however possible to consider a different number of Zener diodes 111 to form the voltage-limiting circuit 11, including a single Zener diode 111, and also to associate the one or more Zener diodes 111 with other electronic components.

In the example illustrated by FIG. 1, the Zener diodes 111 are arranged in series between the input port 12 and the output port 13 of the control circuit 10.

The control system may also include other elements, such as for example protection diodes 17, which are beyond the scope of the present invention.

The control circuit 10 is suitable, conventionally, for charging and discharging the piezoelectric injectors 20. An output voltage, on the output port 13, changes over the course of time, notably by increasing over the course of a charging period and by decreasing over the course of a discharging period. The output voltage value is, because of the voltage-limiting circuit 11 and in the absence of a malfunction of the latter, equal to or lower than a positive theoretical maximum value $V_{MAX}$. In the example illustrated by FIG. 1, by neglecting the voltage across the terminals of the diodes 17 and by considering that the two Zener diodes 111 are identical, the theoretical maximum value $V_{MAX}$ is given by the following expression:

$$V_{MAX}=V_{DCDC}+2\times V_{ZENER}$$

In which expression $V_{ZENER}$ corresponds to the Zener voltage of each Zener diode 111, that is to say the inverse voltage at which the avalanche effect used to limit the output voltage is produced. In the case of a control system for controlling piezoelectric injectors 20, the Zener voltage $V_{ZENER}$ is for example between 15 V and 45 V, for example equal to 30 V.

As illustrated by FIG. 1, the control circuit 10 includes a capacitor 18 arranged between the output port 13 and electrical ground. Preferably, said capacitor 18 is of lower capacitance than that of each piezoelectric injector 20, in order notably to be able to detect a malfunction of open circuit type at a piezoelectric injector, during the charging period of the latter. For example, the capacitance of the capacitor 18 is of the order of a few tens of nanofarads to a few hundred nanofarads, while the capacitance of a piezoelectric injector 20 is for example of the order of one to four microfarads.

As illustrated by FIG. 1, each piezoelectric injector 20 is, between the output port 13 and electrical ground, arranged in series with a commutator 21 suitable for being placed in a closed state and in an open state. In the non-limiting example illustrated by FIG. 1, each commutator 21 is arranged between the associated piezoelectric injector 20 and electrical ground.

The control system also includes a computer (not shown in the figures), which is for example the engine computer in the case of control of piezoelectric injectors 20. The computer may for example control the commutators 14 of the H-bridge of the control circuit 10 and the commutators 21 connected to the piezoelectric injectors 20, and measure the voltage or the image of the voltage supplied to the piezoelectric injectors 20 between the output port 13 and electrical ground. In the context of the present invention, the computer implements the steps of a method 50 for detecting a malfunction of the voltage-limiting circuit 11 described hereinbelow with reference to FIG. 2.

The computer includes for example one or more processors and storage means (magnetic hard disk, electronic memory, optical disk, etc.) on which a computer program product is stored, in the form of a set of program code instructions to be executed to implement the steps of the malfunction detection method 50. Alternatively or complementarily, the computer includes one or more programmable logic circuits (FPGAs, PLDs, etc.), and/or one or more specialized integrated circuits (ASICs, etc.), and/or a set of discrete electronic components, etc., which are suitable for implementing all or some of said steps of the detection method 50.

In other terms, the computer includes a set of means which are configured in the form of software (specific computer program product) and/or hardware (FPGA, PLD, ASIC, discrete electronic components, etc.) to implement the steps of the method 50 for detecting a malfunction of the voltage-limiting circuit 11 described hereinbelow.

Figure 2:
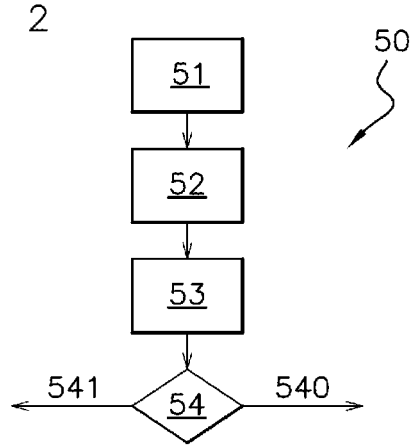
FIG. 2: a diagram illustrating the principal steps of a method for detecting a malfunction of a voltage-limiting circuit.

FIG. 2 schematically shows the principal steps of a method for detecting a malfunction of the voltage-limiting circuit 11 of the control system, which are:

51 placing each commutator 21 in the open state,
52 controlling the control circuit 10 to charge the capacitor 18,
53 measuring the output voltage on the output port 13,
54 evaluating a criterion for detecting a malfunction of the voltage-limiting circuit 11 as a function of the output voltage measured on the output port 13.

Over the course of step 51, the computer places all the commutators 21 of the piezoelectric injectors 20 in the open state, in order to simulate a malfunction of open circuit type on the piezoelectric injectors 20. The activation 52 and measurement 53 steps, at least, are executed while keeping said commutators 21 in the open state.

Over the course of step 52, the computer controls the control circuit 10 so that the latter charges the capacitor 18. As indicated previously, in case of a malfunction of open circuit type at the piezoelectric injectors 20, the output voltage $V_S$ on the output port 13 should in principle converge toward the theoretical maximum value $V_{MAX}$. However, the capacitor 18 charges gradually and the output voltage $V_S$ takes a certain time to reach said theoretical maximum value V. The period of the activation of the control circuit 10, over the course of step 52, should at least make it possible to reach said theoretical maximum value $V_{MAX}$ in case of the absence of a malfunction of the voltage-limiting circuit 11. By "reach the theoretical maximum value $V_{MAX}$", what is meant in practice is approaching said theoretical maximum value $V_{MAX}$, for example exceeding a value equal to 90% of said theoretical maximum value $V_{MAX}$ ($V_S>0.9\times V_{MAX}$), even 95% of said theoretical maximum value $V_{MAX}$ ($V_S>0.95\times V_{MAX}$). In the example illustrated by FIG. 1, a sufficient period to reach the theoretical maximum value $V_{MAX}$ may be easily deduced, in a way known to a person skilled in the art, as a function of the value of the capacitance of the capacitor 18. In the case where the capacitor 18 is of lower capacitance than that of each piezoelectric injector 20, the charging period of a piezoelectric injector 20 may make it possible, during the charging of the capacitor 18, for the output voltage to reach the theoretical maximum value $V_{MAX}$. If necessary, the capacitor 18 may be charged for the same period as for charging a piezoelectric injector 20, so that the control circuit 10 may advantageously be controlled in the same way as when it is used to control a piezoelectric injector 20 over the course of an engine cycle of the motor vehicle.

After the control circuit 10 has been controlled to charge the capacitor 18 for a sufficient period to make it possible, in the absence of a malfunction of the control circuit 10, for the output voltage $V_S$ to reach the theoretical maximum value $V_{MAX}$, the computer measures the output voltage $V_S$ (step 53).

Then, over the course of step 54, evaluating the criterion for detecting a malfunction of the voltage-limiting circuit 11 is aimed at verifying whether or not the output voltage $V_S$ has converged toward the theoretical maximum value $V_{MAX}$. If the output voltage $V_S$ has not converged toward the theoretical maximum value $V_{MAX}$ (reference 540 in FIG. 2), the detection criterion is considered to be verified and a malfunction of the voltage-limiting circuit is detected. In the contrary case (reference 541 in FIG. 2), the detection criterion is not considered to be verified and no malfunction of the voltage-limiting circuit is detected.

Generally, any type of detection criterion may be implemented, as long as it makes it possible to verify whether or not the output voltage $V_S$ has converged toward the theoretical maximum value $V_{MAX}$, and the choice of a particular detection criterion constitutes only a variant embodiment of the invention.

In case of a malfunction of short circuit type of the voltage-limiting circuit 11, then the output voltage $V_S$ should in principle converge toward the input voltage $V_{DCDC}$ without reaching the theoretical maximum value $V_{MAX}$. This type of malfunction may therefore be detected, for example, by comparing the output voltage $V_S$ to a positive first threshold value $V_{S1}$, between $V_{DCDC}$ and $V_{MAX}$. In the example illustrated by FIG. 1, wherein the voltage-limiting circuit 11 is constituted by two Zener diodes 111, the first threshold value $V_{S1}$ is for example equal to:

$$V_{S1}=V_{DCDC}+V_{ZENER}$$

In such a case, evaluating the criterion for detecting a malfunction of the voltage-limiting circuit 11 includes comparing the measured output voltage $V_S$ to the first threshold value $V_{S1}$, and a malfunction (of short circuit type) is detected when said measured output value $V_S$ is lower than said first threshold voltage $V_{S1}$. Thus, it is possible, when this detection criterion is verified, to diagnose the type of malfunction detected (short circuit of the voltage-limiting circuit 11) from the result of evaluating said detection criterion. The advantage of detecting a malfunction of short circuit type of the voltage-limiting circuit 11 is that such a malfunction prevents the detection of a more problematic malfunction at the piezoelectric injectors 20. Thus, when a malfunction of short circuit type of the voltage-limiting circuit 11 is detected, the user of the motor vehicle is furthermore informed of the fact that it is no longer possible to detect a malfunction at the piezoelectric injectors 20.

In case of a malfunction of open circuit type of the voltage-limiting circuit 11, then the output voltage $V_S$ is no longer limited and may exceed the theoretical maximum value $V_{MAX}$. This type of malfunction may therefore be detected, for example, by comparing the output voltage $V_S$ to a second positive threshold value $V_{S2}$, higher than the theoretical maximum value $V_{MAX}$. The second threshold value $V_{S2}$ is for example chosen equal to:

$$V_{S2}=K \times V_{DCDC}$$

in which expression K is a coefficient strictly higher than 1, for example between 1.1 and 1.5 ($1.1 \leq K \leq 1.5$).

In such a case, evaluating the criterion for detecting a malfunction of the voltage-limiting circuit 11 includes comparing the measured output voltage $V_S$ to the second threshold value $V_{S2}$, and a malfunction (of open circuit type) is detected when said measured output voltage $V_S$ is higher than said second threshold voltage $V_{S2}$. Thus, it is possible, when this detection criterion is verified, to diagnose the type of malfunction detected (open circuit of the voltage-limiting circuit 11) from the result of evaluating said detection criterion. The advantage of detecting a malfunction of open circuit type of the voltage-limiting circuit 11 is that such a malfunction prevents the output voltage $V_S$ from being limited, so that the piezoelectric injectors 20 and/or the electronic components of the control system are no longer protected and risk being damaged.

Figure 3:
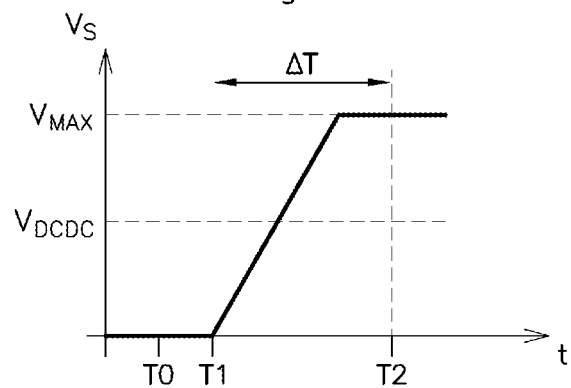
FIG. 3: a timing diagram showing the change in an output voltage of the control system of FIG. 1 during the implementation of the detection method of FIG. 2 in the absence of a malfunction of the voltage-limiting circuit.

FIG. 3 schematically shows the change over time in the output voltage $V_S$ on the output port 13, during the implementation of steps 51, 52 and 53 of the detection method 50, in case of the absence of a malfunction of the voltage-limiting circuit 11.

As illustrated by FIG. 3, the control circuit 10 is initially controlled to not supply the output port 13, so that the output voltage $V_S$ is initially substantially zero. At an instant T0, the computer controls the commutators 21 into the open state. Then, at an instant T1, the computer controls the control circuit 10 to charge the capacitor 18, so that the output voltage $V_S$ increases gradually. At the end of a period $\Delta T$, sufficient to make it possible for the output voltage $V_S$ to reach the theoretical maximum value $V_{MAX}$ in case of the absence of a malfunction of the voltage-limiting circuit 11, the computer measures the output voltage $V_S$ at an instant T2 (T2=T1+$\Delta T$). Given that the voltage-limiting circuit 11 functions normally in the example of FIG. 3, the measured output voltage $V_S$ has reached the theoretical maximum value $V_{MAX}$.

Figure 4:
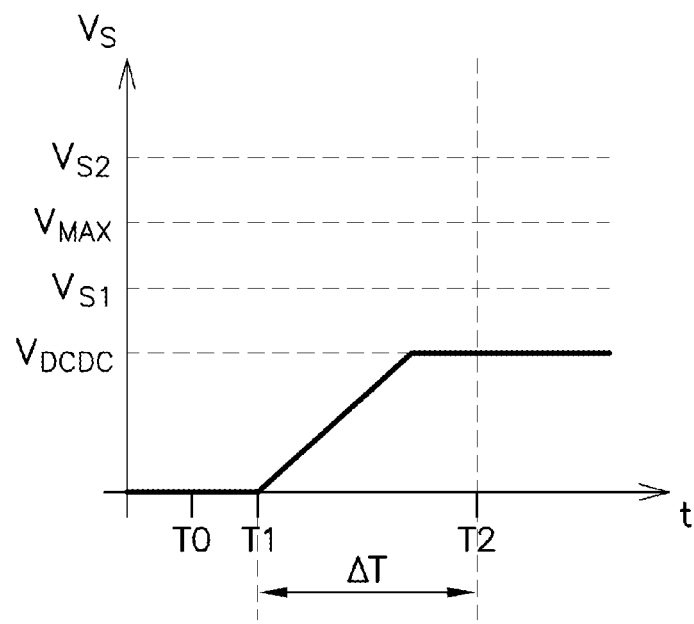
FIG. 4: a timing diagram showing the change in the output voltage of the control system in the presence of a malfunction (short circuit) of the voltage-limiting circuit.

FIG. 4 schematically shows the change over time in the output voltage $V_S$ on the output port 13, during the implementation of steps 51, 52 and 53 of the detection method 50, in case of a malfunction of short circuit type of the voltage-limiting circuit 11.

As illustrated by FIG. 4, the control circuit 10 is initially controlled to not supply the output port 13, so that the output voltage $V_S$ is initially substantially zero. At an instant T0, the computer controls the commutators 21 in the open state. Then, at an instant T1, the computer controls the control circuit 10 to charge the capacitor 18, so that the output voltage $V_S$ increases gradually. At the end of the period $\Delta T$, the computer measures the output voltage $V_S$ at an instant T2 (T2=T1+$\Delta T$). In the example illustrated by FIG. 4, the voltage-limiting circuit 11 is short-circuited and the output voltage $V_S$ has converged toward the input voltage $V_{DCDC}$, and is therefore lower than the first threshold value $V_{S1}$. The detection criterion is therefore verified. The computer detects and diagnoses a malfunction of short circuit type of the voltage-limiting circuit 11, and can inform the user of the motor vehicle of this malfunction and/or of the impossibility of detecting a malfunction at the piezoelectric injectors 20.

Figure 5:
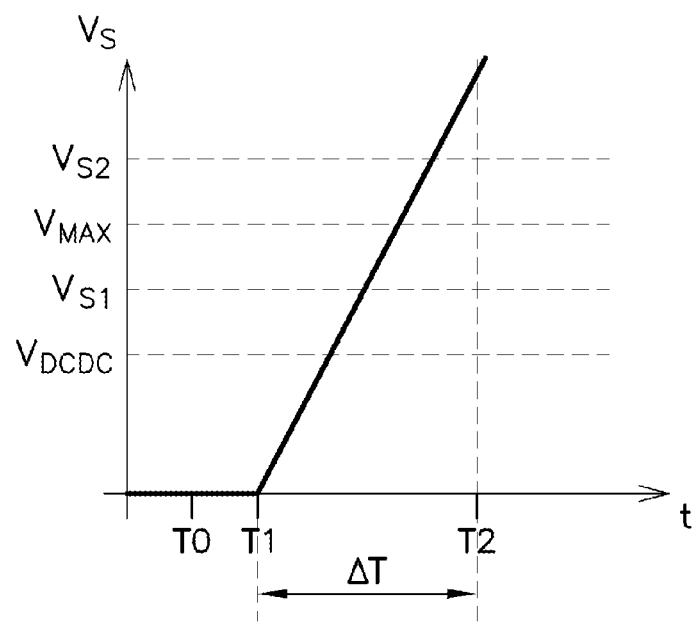
FIG. 5: a timing diagram showing the change in the output voltage of the control system in the presence of a malfunction (open circuit) of the voltage-limiting circuit.

FIG. 5 schematically shows the change over time in the output voltage $V_S$ on the output port 13, during the implementation of steps 51, 52 and 53 of the detection method 50, in case of a malfunction of open circuit type of the voltage-limiting circuit 11.

As illustrated by FIG. 5, the control circuit 10 is initially controlled to not supply the output port 13, so that the output voltage $V_S$ is initially substantially zero. At an instant T0, the computer controls the commutators 21 in the open state. Then, at an instant T1, the computer controls the control circuit 10 to charge the capacitor 18, so that the output voltage $V_S$ increases gradually. At the end of the period $\Delta T$, the computer measures the output voltage $V_S$ at an instant T2 (T2=T1+$\Delta T$). In the example illustrated by FIG. 5, the voltage-limiting circuit 11 is in an open circuit so that the output voltage $V_S$ is no longer limited and has exceeded the theoretical maximum value $V_{MAX}$ and the second threshold value $V_{S2}$. The detection criterion is therefore verified. The computer detects and diagnoses a malfunction of open circuit type of the voltage-limiting circuit 11, and may deactivate the control circuit 10 and inform the user of the motor vehicle of this malfunction.

More generally, it should be noted that the implementations and embodiments considered above have been described as non-limiting examples, and that other variants may consequently be envisaged.

Notably, the invention has been described considering a control system used for piezoelectric injectors 20 of a motor vehicle engine. There is nothing to rule out, according to other examples, considering other types of motor vehicle actuators. The actuators must however be capacitive, so that an open circuit on these capacitive actuators should be reflected in a faster increase of the output voltage upon the activation of the control circuit 10. In other terms, the apparent value of the capacitance at the output port 13 should be decreased in case of an open circuit on the capacitive actuators.

Furthermore, the invention is applicable including in the case of a control system used with a single capacitive actuator.

The description hereinabove clearly illustrates that, through its various features and their advantages, the present invention achieves the aims that it has set itself. In particular, the present invention makes it possible to detect a malfunction of the voltage-limiting circuit 11 of a control system for controlling one or more capacitive actuators, notably piezoelectric injectors 20. The method 50 for detecting a malfunction of a voltage-limiting circuit 11 is for example implemented outside of the normal usage phases of the capacitive actuators, for example at the initialization of the engine computer of the motor vehicle, upon the startup of the latter.

The invention claimed is:

1. A method (50) for detecting a malfunction of a voltage-limiting circuit (11) of a control circuit (10) for controlling a capacitive actuator (20) of a motor vehicle, said capacitive actuator being connected to an output port (13) of said control circuit, said control circuit being controlled to charge/discharge said capacitive actuator, an output voltage on the output port being, in the absence of a malfunction of the voltage-limiting circuit, equal to or lower than a theoretical maximum value ($V_{MAX}$), wherein, the capacitive actuator (20) being, between the output port and electrical ground, arranged in series with a commutator (21) suitable for being placed in a closed state and in an open state, and the control circuit (10) including a capacitor (18) arranged between the output port (13) and the electrical ground, said method (50) comprising the steps of:
  (51) placing the commutator (21) in the open state,
  (52) controlling the control circuit (10) to charge said capacitor for a predefined period to make it possible, in the absence of a malfunction of the voltage-limiting circuit, for the output voltage to reach the theoretical maximum value,
  (53) measuring the output voltage on the output port (13),
  (54) evaluating a criterion for detecting a malfunction of the voltage-limiting circuit (11) as a function of the measured output voltage, a malfunction of the voltage-limiting circuit (11) being detected when the criterion is verified.

2. The method (50) as claimed in claim 1, wherein evaluating the criterion for detecting a malfunction of the voltage-limiting circuit (11) includes comparing the measured output voltage to a predefined first threshold value (Vsi) lower than the theoretical maximum value of the output voltage, a malfunction being detected when said measured output voltage is lower than said predefined first threshold value.

3. The method (50) as claimed in claim 2, wherein evaluating the criterion for detecting a malfunction of the voltage-limiting circuit (1 1) includes comparing the measured output voltage to a predefined second threshold value (Vs2) higher than the theoretical maximum value of the output voltage, a malfunction being detected when said measured output voltage is higher than said predefined second threshold value.

4. The method (50) as claimed in claim 2, wherein the voltage-limiting circuit (11) includes one or more Zener diodes (111).

5. The method (50) as claimed in claim 2, wherein the capacitive actuator (20) is a piezoelectric injector.

6. A non-transitory computer-readable medium on which is stored a computer program which, when executed by a motor vehicle computer, performs the method of claim 2.

7. The method (50) as claimed in claim 1, wherein evaluating the criterion for detecting a malfunction of the voltage-limiting circuit (11) includes comparing the measured output voltage to a predefined second threshold value ($Vs_2$) higher than the theoretical maximum value of the output voltage, a malfunction being detected when said measured output voltage is higher than said predefined second threshold value.

8. The method (50) as claimed in claim 7, wherein the voltage-limiting circuit (11) includes one or more Zener diodes (111).

9. The method (50) as claimed in claim 7, wherein the capacitive actuator (20) is a piezoelectric injector.

10. A non-transitory computer-readable medium on which is stored a computer program which, when executed by a motor vehicle computer, performs the method of claim 7.

11. The method (50) as claimed in claim 1, wherein the voltage-limiting circuit (11) includes one or more Zener diodes (111).

12. The method (50) as claimed in claim 11, wherein the capacitive actuator (20) is a piezoelectric injector.

13. The method (50) as claimed in claim 1, wherein the capacitive actuator (20) is a piezoelectric injector.

14. A motor vehicle computer, comprising means configured to implement the method (50) as claimed in claim 1.

15. A system for controlling a capacitive actuator (20) of a motor vehicle, comprising a control circuit (10) including a voltage-limiting circuit (11) and an output port (13) connected to said capacitive actuator, an output voltage on the output port being, in the absence of a malfunction of the voltage-limiting circuit, equal to or lower than a theoretical maximum value ($V_{MAX}$), wherein, the capacitive actuator (20) being, between the output port and electrical ground, arranged in series with a commutator (21) suitable for being placed in a closed state and in an open state, said system further comprising a capacitor (18) arranged between the output port (13) and the electrical ground and the motor vehicle computer as claimed in claim 14.

16. The system as claimed in claim 15, wherein the voltage-limiting circuit (11) includes one or more Zener diodes (111).

17. A motor vehicle, comprising a capacitive actuator (20) and the system as claimed in claim 16.

18. A motor vehicle, comprising a capacitive actuator (20) and the system as claimed in claim 15.

19. The motor vehicle as claimed in claim 18, wherein the capacitive actuator (20) is a piezoelectric injector.

20. A non-transitory computer-readable medium on which is stored a computer program which, when executed by a motor vehicle computer, performs the method of claim 1.

* * * * *